(12) United States Patent
Repetto et al.

(10) Patent No.: US 7,932,524 B2
(45) Date of Patent: Apr. 26, 2011

(54) TRANSPARENT LED DISPLAY AND METHOD FOR MANUFACTURE THEREOF

(75) Inventors: Piermario Repetto, Turin (IT); Sabino Sinesi, Turin (IT); Sara Padovani, Turin (IT); Stefano Bernard, Turin (IT); Denis Bollea, Turin (IT); Davide Capello, Turin (IT); Alberto Pairetti, Udine (IT); Michele Antonipieri, Udine (IT)

(73) Assignee: C.R.F. Societa Consortile per Azioni, Orbassano (Torino) (IT)

( * ) Notice: Subject to any disclaimer, the term of this patent is extended or adjusted under 35 U.S.C. 154(b) by 1403 days.

(21) Appl. No.: 11/397,225

(22) Filed: Apr. 4, 2006

(65) Prior Publication Data

US 2006/0238326 A1 Oct. 26, 2006

(30) Foreign Application Priority Data

Apr. 21, 2005 (EP) .................................. 05425255

(51) Int. Cl.
*H01L 33/36* (2010.01)
(52) U.S. Cl. .................................. 257/88; 257/E33.062
(58) Field of Classification Search .................. 257/59, 257/72, E33.64, E31.126, 88, 99, E33.057, 257/E33.062, E33.065, E33.071; 313/500; 345/82

See application file for complete search history.

(56) References Cited

U.S. PATENT DOCUMENTS

| | | | | |
|---|---|---|---|---|
| 4,241,277 A | * | 12/1980 | Hintze et al. | 313/500 |
| 4,485,377 A | * | 11/1984 | Claus et al. | 345/82 |
| 5,278,432 A | | 1/1994 | Ignatius et al. | 257/88 |
| 5,475,241 A | * | 12/1995 | Harrah et al. | 257/99 |
| 5,638,052 A | * | 6/1997 | Furuya et al. | 340/815.45 |
| 5,818,404 A | * | 10/1998 | Lebby et al. | 345/82 |
| 6,087,680 A | * | 7/2000 | Gramann et al. | 257/91 |
| 6,485,995 B2 | * | 11/2002 | Trezza et al. | 438/25 |
| 2002/0074557 A1 | * | 6/2002 | Uda et al. | 257/88 |
| 2002/0084952 A1 | | 7/2002 | Morley et al. | 345/32 |
| 2003/0076033 A1 | * | 4/2003 | Wu | 313/512 |
| 2003/0223236 A1 | | 12/2003 | Wu | 362/247 |
| 2004/0027314 A1 | * | 2/2004 | Natori | 345/30 |
| 2005/0102807 A1 | * | 5/2005 | Takeuchi et al. | 29/25.35 |

(Continued)

FOREIGN PATENT DOCUMENTS

EP 0177134 4/1986

(Continued)

OTHER PUBLICATIONS

European Patent Office Search Report, Application No. EP 05 42 5255, Oct. 24, 2005, 2 pages.

(Continued)

*Primary Examiner* — Evan Pert
*Assistant Examiner* — Eduardo A Rodela
(74) *Attorney, Agent, or Firm* — Heslin Rothenberg Farley & Mesiti P.C.; Victor A. Cardona (57) ABSTRACT

Described herein is a transparent device for display of information superimposed on a background, said device comprising a plurality of LED sources, addressable individually or in groups through a series of conductive paths deposited on a transparent underlayer and connected to a control electronics, in which: i) said LED sources are integrated in the form of dice, i.e., of elements obtained by dividing up a semiconductor wafer and without package; and ii) at least one of said conductive paths is with interrupted stretches and replaced by stretches of metal wire, bonded to said paths through a wire-bonding operation.

42 Claims, 7 Drawing Sheets

U.S. PATENT DOCUMENTS

| | | | |
|---|---|---|---|
| 2005/0123243 A1* | 6/2005 | Steckl et al. | 385/40 |
| 2006/0077307 A1* | 4/2006 | Thielemans et al. | 348/800 |
| 2006/0215386 A1* | 9/2006 | Hatanaka et al. | 362/29 |

FOREIGN PATENT DOCUMENTS

| | | |
|---|---|---|
| EP | 0588040 | 3/1994 |
| EP | 1460609 | 9/2004 |
| JP | 62215289 | 9/1987 |
| JP | 01311501 | 12/1989 |
| JP | 08172219 | 7/1996 |
| WO | WO 03/012884 A1 | 2/2003 |
| WO | WO 2004/068596 A1 | 8/2004 |

OTHER PUBLICATIONS

U.S. Appl. No. 11/398,358, filed Apr. 5, 2006, Repetto et al.
U.S. Appl. No. 11/399,208, filed Apr. 6, 2006, Repetto et al.

* cited by examiner

TRANSPARENT LED DISPLAY AND METHOD FOR MANUFACTURE THEREOF

This application claims priority from European Patent Application No. 05425255.6, filed on Apr. 21, 2006, the entire disclosure of which is incorporated herein by reference.

BACKGROUND OF THE INVENTION

The present invention relates to a device for the presentation of information, characterized in that it is at the same time transparent, i.e., it enables vision of the scene at the rear of the device, and emissive, i.e., it presents the user with information in the form of light emitted by the device itself.

A device of this type is of particular interest for the vehicle sector in so far as it enables presentation of the information on two different planes, namely, the background, i.e., the external scene visible to the user through the windows of the vehicle, such as the windscreen, rear window and side windows, and the light image generated by the device.

The interest of this type of devices is not limited, however, to the vehicle sector; the advertising sector or that of information to the public are just two examples of the possible fields of application of the device.

Transparent devices based upon light-emitting diodes (LEDs) are already present in the known art; for example, the patent application No. EP1460609 describes a solution for transparent and programmable LED displays comprising: an array of LEDs in a row-column configuration, each row of said LEDs being connected by an electric wire, each column being connected to a transparent-conductive-oxide (TCO) layer deposited on the underlayer, said transparent layer being electrically insulated from said row of wires; and means for electrical turning-on associated to said array.

The use of metal wires for interconnecting the LEDs of each row enables a reduction in the voltage drops due to the electrical resistance of the row and hence use of decidedly lower supply voltages. Said metal wires are bonded on the underlayer of TCO only in areas corresponding to purposely provided pads obtained by cutting the layer of TCO along a closed circular path, so as to insulate said pads electrically from the corresponding column of TCO.

The solution described in the patent application No. EP1460609 presents a series of limitations:
- the transparency is limited on account of the dimensions of the LED components in SMD format, which becomes particularly critical if the aim is to increase the density of the LEDs or reduce the dimensions of the device;
- the process steps regarding the positioning of the wires constituting the rows and the corresponding operations of bonding on the pads are not obtainable using standard technologies and machinery for SMD technology, thus rendering fabrication of the device more costly;
- if the dimensions of the device are reduced, the technological steps described above become more complex and the production yields decrease; and
- the formation of insulated pads along the columns of TCO produces a local narrowing of the paths and hence an increase in the in-series resistance and thus limits the number of addressable rows.

SUMMARY OF THE INVENTION

In order to overcome the drawbacks described above, the subject of the invention is a display according to claim 1. Further advantageous characteristics are indicated in claims 2-19 and 25-36. Also forming the subject of the invention is a method for making the display, having the characteristics indicated in claim 20.

The present invention is consequently able to overcome the drawbacks of the known art through:
- the use of LED sources in the form of dice, i.e., of semiconductors not provided with package; this enables a reduction to the minimum of the dimension of the source and an increase in the transparency of the display; and
- the use of the wire-bonding process for electrical connection of groups of dice between one another.

LED sources can be integrated directly in the form of chips or dice (multilayer semiconductor elements that emit light radiation if electrically supplied) on a printed circuit. Some typical applications are light signalling devices, headlights or other lights for motor vehicles, devices for information to the public, etc.

The technique for fabrication of said devices goes under the name of chip-on-board (COB) technology and consists in the mounting of arrays of LED chips directly on an appropriate underlayer. Said technology comprises first the process known by the term "die-bonding" (i.e., thermal or electrothermal connection of the die to the underlayer), associated to which are possible operations of "wire bonding" (electrical connection of the chip to the circuit). Amongst the die-bonding techniques, flip-chip methodology envisages the turning of the chip upside down and electro-thermal connection to the circuit of its pads without using wires for the electrical connection, thus excluding a further wire-bonding process. In the flip-chip process, the connections of the pads are typically obtained by means of metal bumps (balls). As final step, the COB process envisages packaging or protection of the source from the external stresses using appropriate resins.

BRIEF DESCRIPTION OF THE DRAWINGS

The invention will now be described with reference to the annexed plate of drawings, in which.

DETAILED DESCRIPTION OF THE INVENTION

In the preferred embodiment represented in FIGS. 1, 2, 3 and 4, the LED sources are arranged in a matrix configuration, in which each LED is positioned at the point of crossing-over of a row 20 and a column 10, in such a way as to be addressable individually through the application of an appropriate potential difference between said row and said column.

Figure 1:
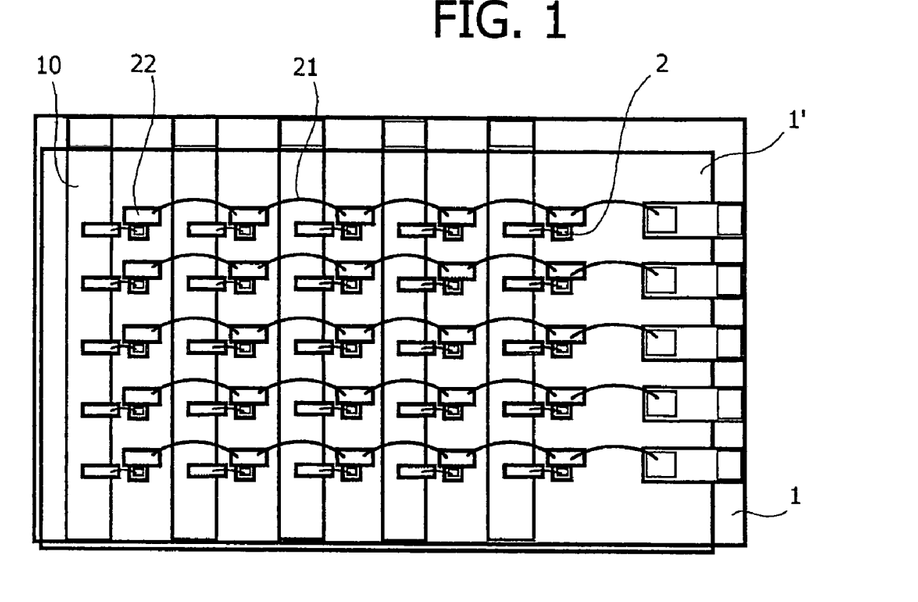
FIGS. 1-4 illustrate a preferred embodiment of the invention.
Figure 2:
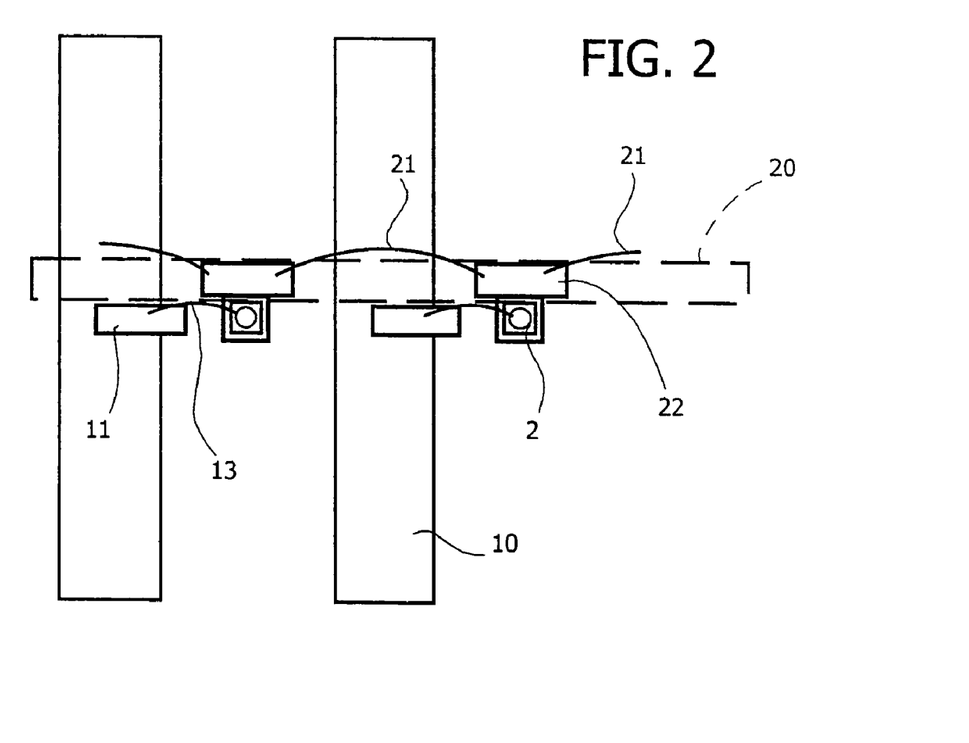

In the solution represented in FIGS. 1 and 2, the process of fabrication comprises the following steps:
1) preparation of the (glass or plastic) underlayer coated with transparent conductive oxide (for example, indium-tin oxide—ITO);
2) separation of the columns of TCO 10 (through a photolithographic process or a laser-ablation process);
3) formation of metal pads, two for each die, of which one, 11, at least in part set on top of the respective column of TCO and the other, 22, set between said column of TCO and the adjacent column of TCO, in areas corresponding to the row; the formation of the pads can be obtained, for example, through a technique of shadow masking, or else through a uniform evaporation of the metal and a subsequent removal via photolithography; this step is necessary for guaranteeing a good adhesion of the metal bond on the underlayer;

4) pick-and-place of the die 2 on the respective metal pad 22;

5) die-attach of the die 2 with electrically and thermally conductive resin;

6) wire bonding between the top electrode of each individual die and the respective metal pad 11;

7) wire bonding between the metal pad 22 of each individual die and the metal pad 22 of the subsequent die along the same address row; and 8) protective coating with transparent resin (for example, silicone or epoxy resin) and overlayer (of glass or plastic).

The use of an overlayer 1' (of glass or plastic) has the function of guaranteeing planarity of the protective layer of transparent resin, not only in order to ensure transparency of the device, but also to ensure that the panel will not distort the view of the background and/or will not introduce optical power.

In the embodiment described above (represented in FIGS. 1 and 2), the dice are of the vertical-electrode type, i.e., the anode and cathode are arranged, respectively, on the two opposite faces of the die, in such a way that the electrical contact with the rows 20 is guaranteed by the conductive resin used for the die-attach, where the electrical contact with the columns 10 of TCO is guaranteed by the connection via wire bonding between the electrode on the top face of the die and the respective pad 11.

Figure 3:
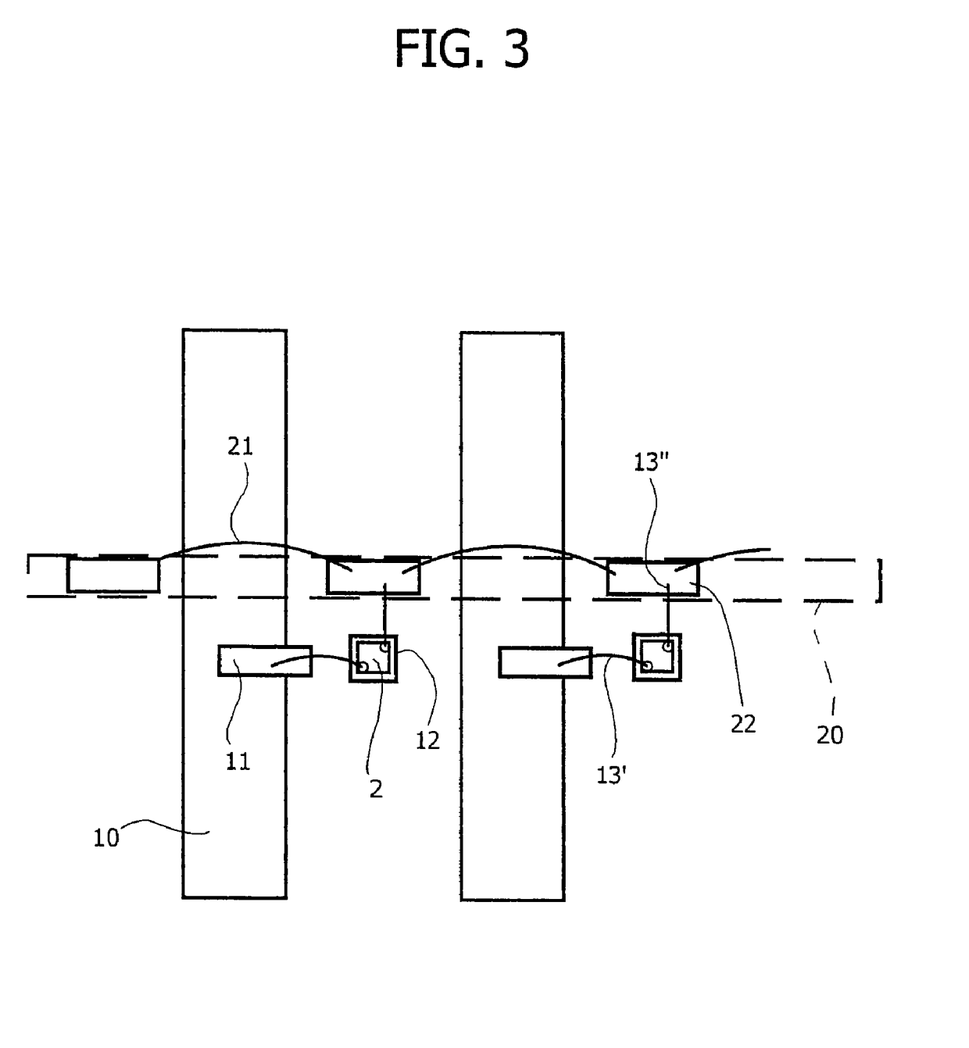

In a further embodiment, represented in FIG. 3, it is possible to use dice with horizontal electrodes, i.e., ones on the same face; in this case, the dice are positioned with both of the electrodes on the top face and the die-attach operation only has the function of bonding the die to the underlayer and guaranteeing thermal dissipation, but not guaranteeing electrical conduction.

The steps of the process described above are replaced by the following steps:

1) preparation of the (glass or plastic) underlayer coated with transparent conductive oxide (TCO; for example, indium-tin oxide—ITO);

2) separation of the columns of TCO 10 (through a photolithographic process or a laser-ablation process);

3) formation of metal pads, 3 for each LED chip, of which the first (11) at least in part overlying the respective column of TCO, the second (12) and the third (22) set between said column of TCO and the adjacent column of TCO, in areas corresponding to the row; the formation of the pads can be obtained, for example, through a technique of shadow masking, or else through a uniform evaporation of the metal and a subsequent removal via photolithography; this step is necessary for guaranteeing a good adhesion of the metal bond on the underlayer.

4) pick-and-place of the die on the respective metal pad 12;

5) die-attach of the die with thermally conductive resin;

6) wire bonding between the electrodes of one and the same type (for example, the cathodes) of each individual die and the respective pads 11;

7) wire bonding between the electrodes of the other type (for example, the anodes) and the respective pads 22;

8) wire bonding between the metal pad 22 of each individual LED chip and the metal pad 22 of the subsequent LED chip along the same address row;

9) protective coating with transparent resin (for example, silicone or epoxy resin) and overlayer (glass or plastic).

Figure 4:
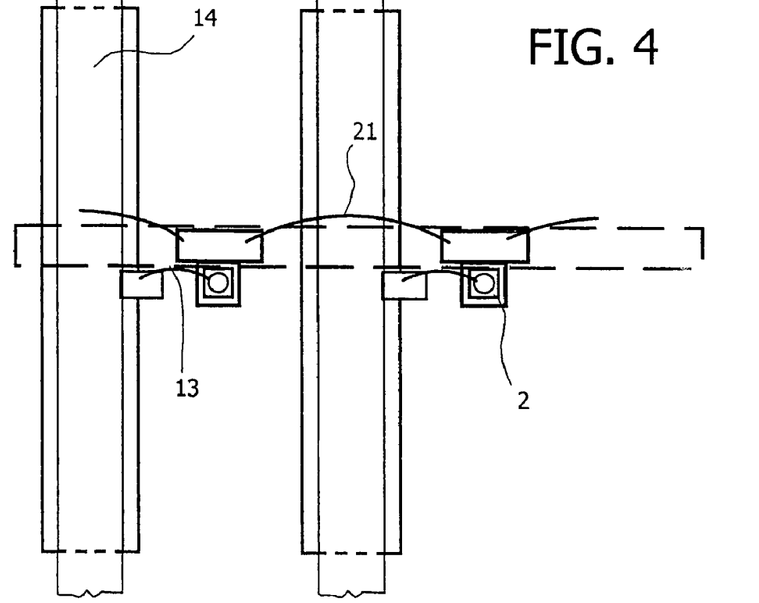

FIG. 4 illustrates a variant of FIG. 2, in which an additional insulating layer 14 is provided in the central part of the columns, in such a way as to prevent the wire from coming into contact with the columns 10 of TCO, on account of the pressure exerted on the wire used for wire bonding during the process of packaging, and from thus impairing operation of the corresponding row and column.

Figure 5:
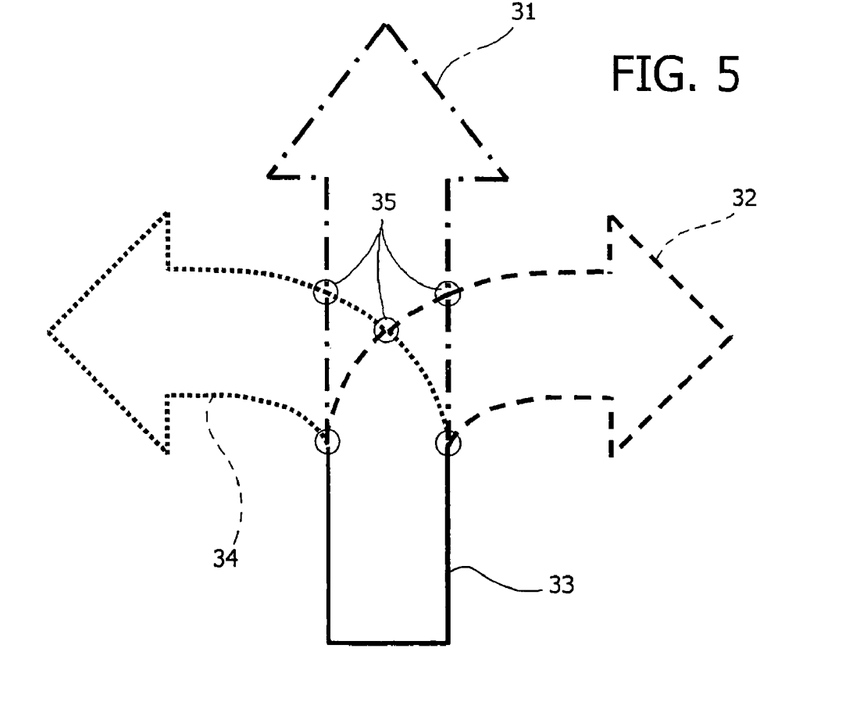
FIGS. 5-7 illustrate an alternative embodiment.
Figure 6A:
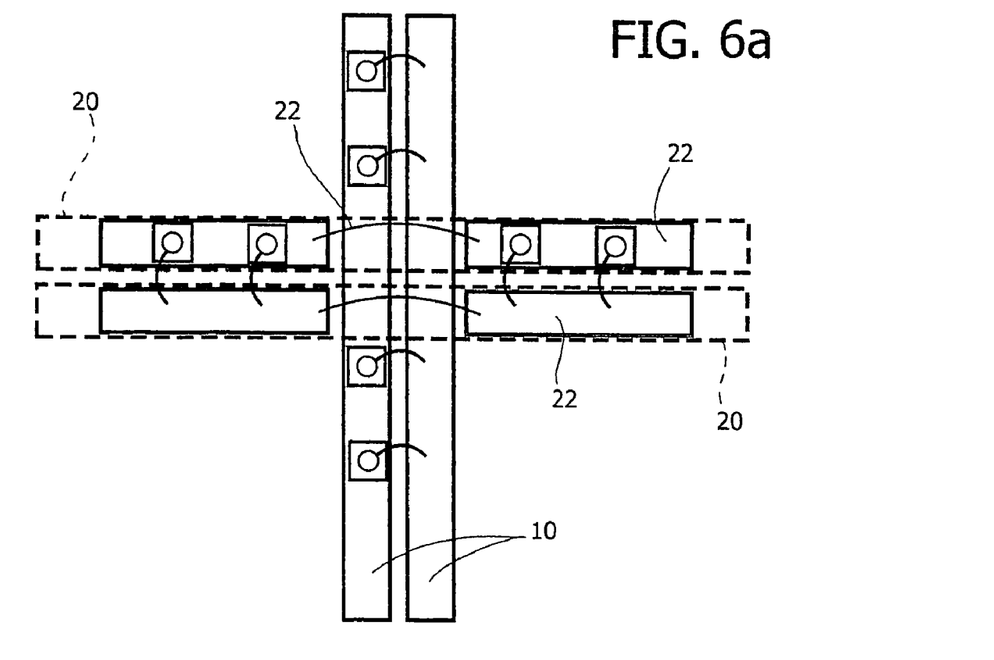
Figure 6B:
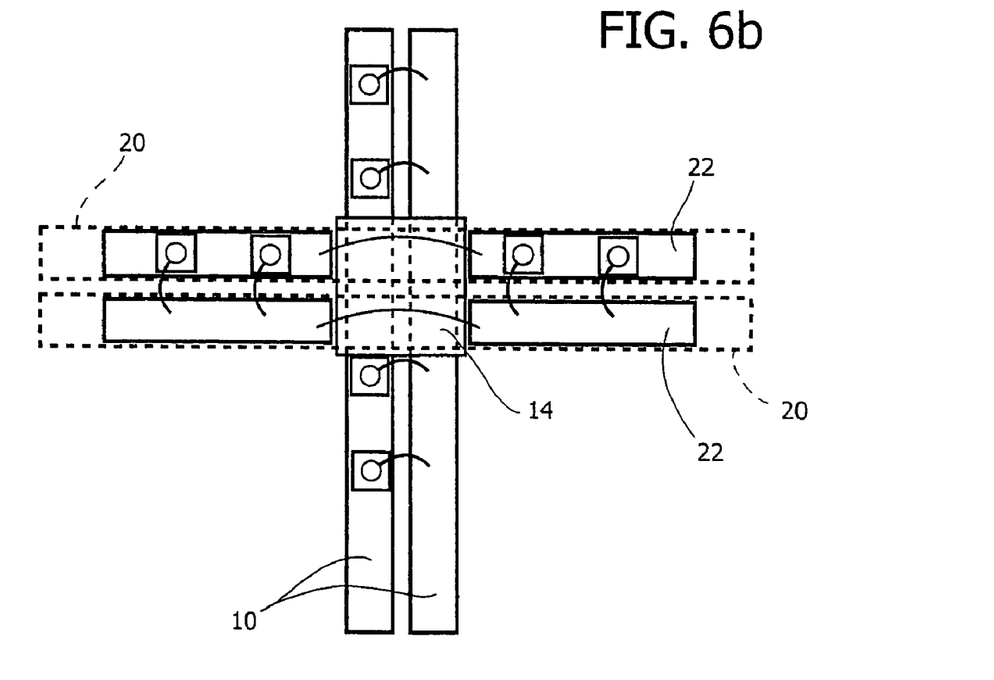
Figure 7:
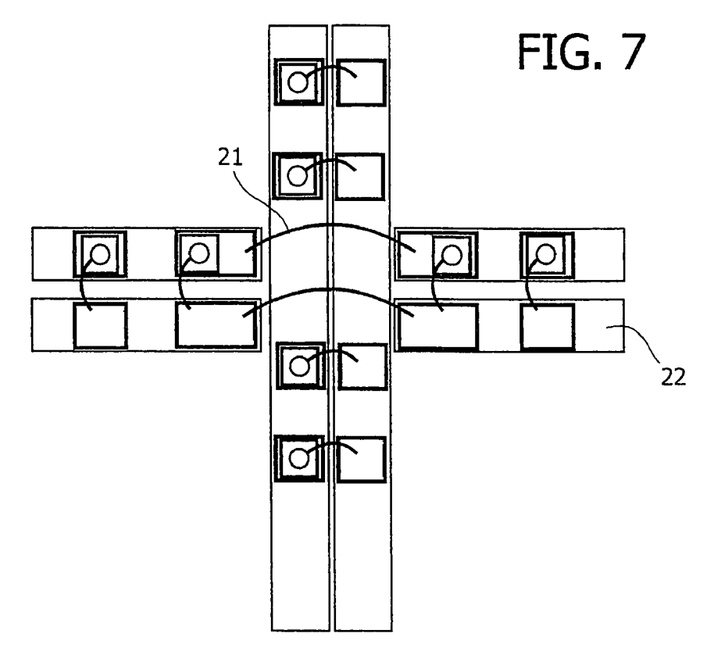

In a further embodiment, represented in FIGS. 5, 6 and 7, the LEDs are not arranged in a matrix configuration (i.e., individually addressable), but rather are addressable in groups, with the LEDs of each group electrically connected together in parallel or in series.

FIG. 5 illustrates an example of an image that can be presented on a display according to the present invention; each segment (31, 32, 33 and 34) represents a set of LEDs electrically connected in parallel or in series. Each segment, which is addressable in an independent way, can be constituted by a pair of parallel paths (FIGS. 6 and 7), one of which is electrically connected to the electrodes of the same type (for example, the cathodes) of a parallel of LEDs, whilst the other is electrically connected to the electrodes of the other type (for example, the anodes). In the points of intersection 35 between two or more segments it is necessary to insulate electrically the paths belonging to different segments; this is obtained, according to the present invention, by interrupting the paths 20 of one of said segments so as to enable the passage of the paths 10 of another of said segments and by connecting the stretches 22 of said paths 20 with the stretches 21 of conductive wire deposited through a wire-bonding process (FIGS. 6a, 6b, 7).

FIG. 6b presents a variant, in which an insulating layer is deposited on top of the paths 10 in areas corresponding to said points of intersection 35 so as to prevent said stretches of wire 21 from coming into electrical contact with said paths 10 on account of a deformation of the wire.

Figure 8:
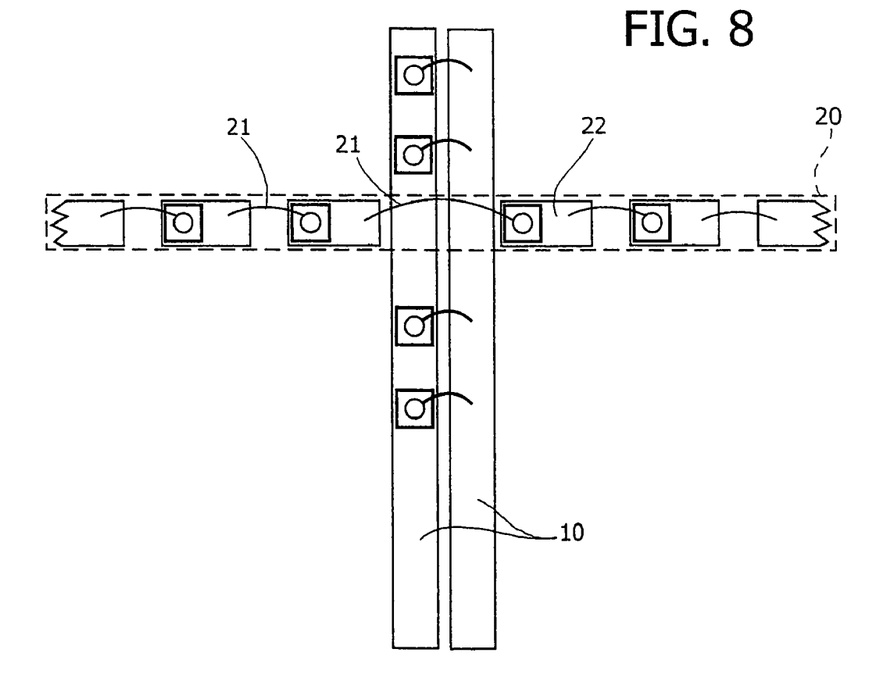
FIGS. 8 and 9 illustrate two further variants.

A further variant of the present invention is represented in FIG. 8. In this variant one of the two segments is constituted by a set of LEDs in series, whilst the other is constituted by a set of LEDs in parallel. In the point of intersection 35 between the two segments, the electrical insulation between the path 20 of the first segment and the paths 10 of the second segment is obtained in a way similar to what is indicated with reference to FIGS. 6 and 7.

Figure 9:
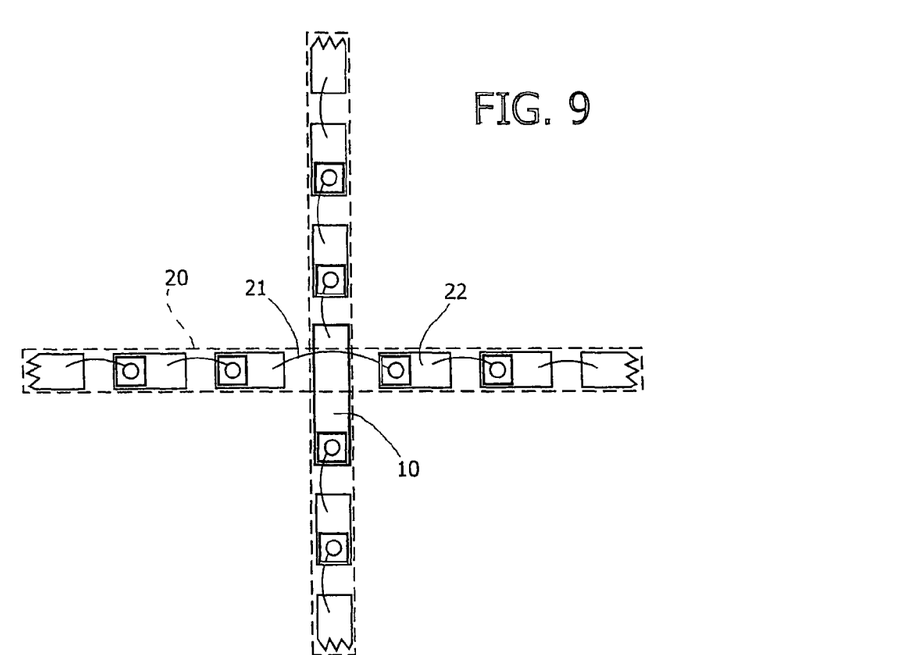

A further variant of the present invention is represented in FIG. 9. In this variant, both of the segments are constituted by a set of LEDs, connected together in series. In the point of intersection 35 between the two segments, the electrical insulation between the path 20 of the first segment and the path 10 of the second segment is obtained in a way similar to what is described with reference to FIGS. 6 and 8.

Again with reference to FIG. 5, it is evident that the smaller the number of LEDs used to obtain the segments 31, 32, 33 and 34, the more the appearance of said segments of the image will be dashed.

In order to limit the number of LED sources, at the same time reducing this effect of dashed appearance of the image, according to a variant of said invention (FIGS. 10 and 11) the aim is to provide on the external surface of the underlayer 1 and/or of the overlayer 1', in areas corresponding to the dice, appropriate micro-indentations 36 along the line of connection of the dice, said micro-indentations 36 having the function of extracting light from the underlayer 1 and/or from the overlayer 1' so as to connect the points of light and generate light images in the form of continuous lines.

Figure 10:
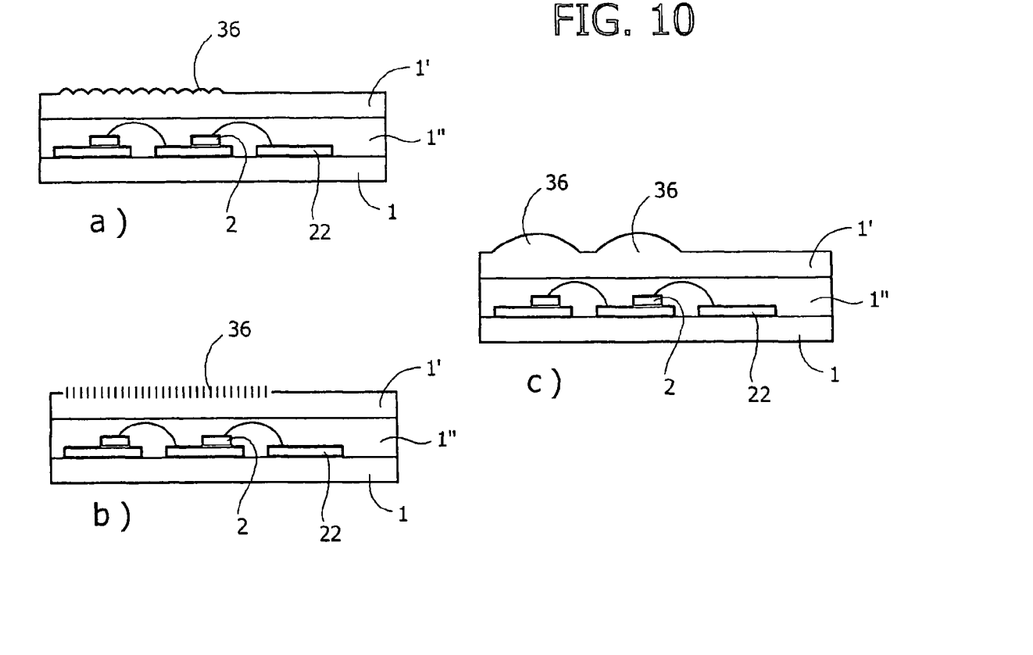
FIGS. 10 and 11 illustrate a further variant.
Figure 11:
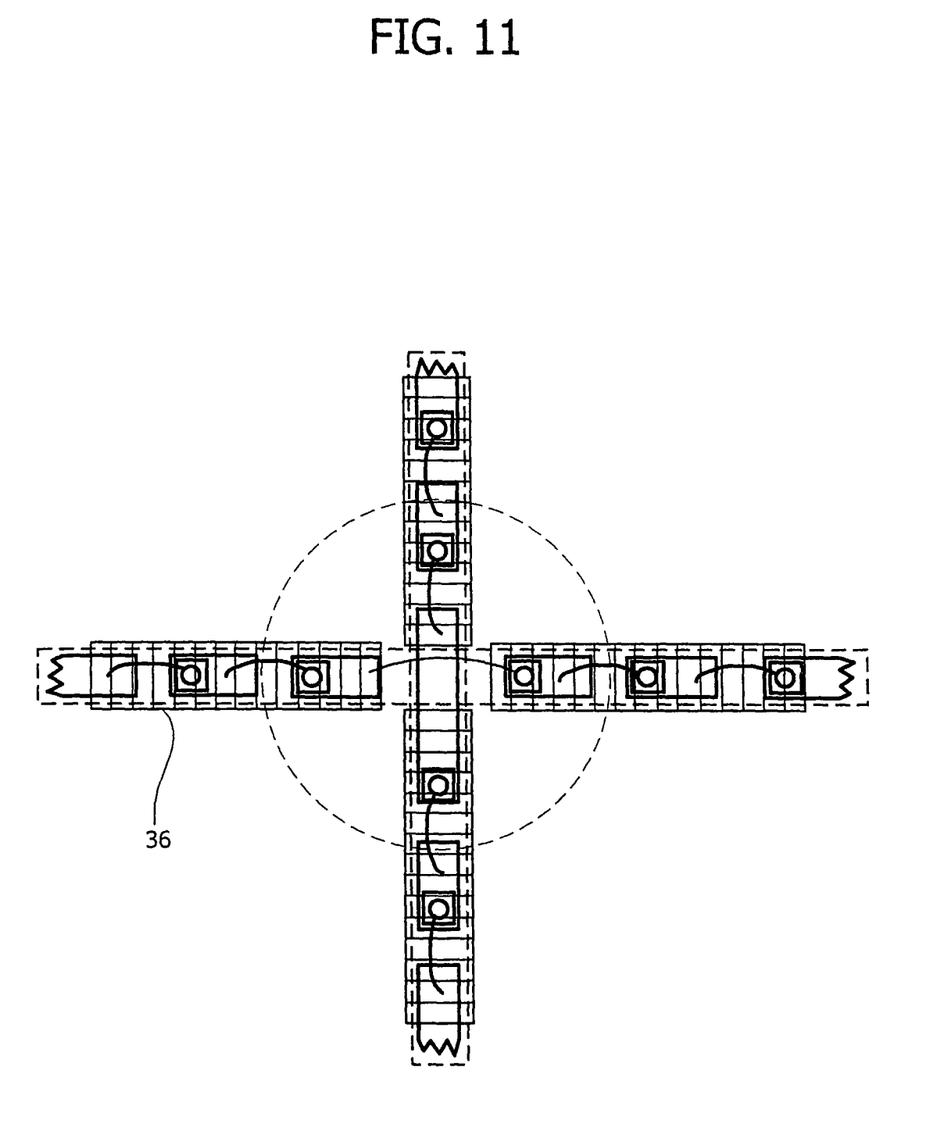

Said effect can be further strengthened by the metal pads that are deposited on the paths made of TCO for the purpose of improving adhesion of the bonding operations (or else directly by the conductive paths 10, 20 that connect the sources, in the case where said paths are made of metal instead of TCO). In fact, said pads tend to reflect part of the light emitted by the lateral surfaces of the die; the reflected light impinges upon the micro-indentations 36, which produces an increase in the actual dimensions of the source.

A further solution that can be adopted is to deposit the protective resin 1" in the form of paths that connect the different dice. The light emitted by the dice is thus in part entrapped by said paths of resin (light-guide effect) and subsequently extracted by purposely provided micro-indentations 36 made on the surface of said path of resin, or else, in the case where an overlayer 1' is used, on the surface of said overlayer.

Said micro-indentations 36 may be in the form of cylindrical microlenses with axis perpendicular to the line of connection of the dice (FIG. 10a), generic grooves made along an axis perpendicular to the line of connection of the dice (FIG. 10b), or cylindrical lenses (one for each die) with axis perpendicular to the line of connection of the dice (FIG. 10c).

Alternatively, said micro-indentations can be in the form of microlenses with rotational symmetry, each microlens having its axis of symmetry perpendicular to said underlayer 1 and passing through the centre of one of said dice.

The micro-indentations 36 can also be simply areas with high roughness, such as to diffuse the light emitted by the LEDs.

According to a further variant of the present invention, said effect of dashed appearance of the image can be reduced or eliminated using a density of LED sources, i.e., a number of dice per unit length, such that the angular separation between two sources with respect to the eye of the user is comparable with the angular resolution of the eye.

By way of example, if the display is installed at a distance of 1 m from the driver and the distance between two adjacent dice is 0.3 mm, i.e., comparable with the dimensions of the die, the angular separation between the LEDs is approximately 1 minute of arc, equal to the resolution of the eye in the fovea.

It is known, however, how the eye will tend to merge points angularly separated by up to 3 minutes of arc, which would enable the spacing between the pixels to be increased up to 1 mm, thus reducing the number of sources necessary by a factor of 3.

What is claimed is:

1. A transparent device for the display of information superimposed on a background, said device comprising:
   a plurality of LED sources, addressable individually or in groups through a series of conductive paths deposited on a transparent underlayer and connected to a control electronics,
   wherein said LED sources are integrated in the form of dice, said dice comprising elements obtained by dividing up a semiconductor wafer and without package, on said transparent underlayer via technologies of a chip-on-board type;
   wherein each LED is positioned at a point of crossing-over between a row and a column, in such a way as to be addressable individually via application of an appropriate potential difference between said row and said column;
   wherein said columns of said array comprise continuous column conductive paths of a same material deposited on said underlayer, and said rows of said array include row stretches of row conductive path deposited on said underlayer between the columns, the row stretches connected to each other across the columns through bridging stretches of metal wire having ends of said bridging stretches connected by wire-bonding technology to said row stretches of row conductive path, said stretches of metal wire avoiding electrical connection with said column conductive paths;
   wherein the electrical contacts made on each die through wire bonding and said stretches of metal wire are englobed within a protective layer;
   wherein said underlayer is transparent and said protective layer is a layer of transparent resin; and
   each die of said dies electrically connected to a respective column of said columns by a stretch of metal wire bonded to a metal pad connected to, and at least in part superimposed on, the respective column.

2. The device according to claim 1, wherein said conductive paths consist of transparent conductive oxide deposited on said underlayer.

3. The device according to claim 2, wherein on said paths of TCO metal pads are deposited in areas corresponding to the points on which said stretches of metal wire will be bonded, in order to improve adhesion of the bonding.

4. The device according to claim 2, wherein on said paths of TCO metal pads are deposited in areas corresponding to the points on which the die will be bonded through the die-attach operation.

5. The device according to claim 1, wherein said stretches of conductive path consist of transparent conductive oxide deposited on said underlayer.

6. The device according to claim 1, wherein said conductive paths consist of a metal layer deposited on said underlayer.

7. The device according to claim 1, wherein said stretches of conductive path consist of a metal layer deposited on said underlayer.

8. The device according to claim 1, wherein said LED sources in the form of dice are of the vertical-electrode type, said dice comprising electrodes arranged on opposite faces of each die of dice.

9. The device according to claim 8, wherein the electrode on the face of the die facing the underlayer is electrically connected to one of said conductive paths through an operation of die-attach by means of electrically conductive resin, whilst the electrode on the opposite face is electrically connected to another conductive path with a stretch of metal wire bonded via a wire-bonding operation.

10. The device according to claim 1, wherein said LED sources in the form of dice are of the type with horizontal electrodes, said dice comprising electrodes arranged on the same face of each die.

11. The device according to claim 10, wherein both of the electrodes are electrically connected to the respective conductive path with a stretch of metal wire, said stretches of metal wire being bonded via a wire-bonding operation.

12. The device according to claim 10, wherein the die is bonded on a conductive pad through a die-attach operation by means of thermally conductive resin.

13. The device according to claim 1, wherein deposited on at least part of said columns is a layer of insulating material, having the function of preventing said stretches of metal wire from coming into electrical contact with said conductive paths.

14. The device according to claim 1, wherein deposited on said LED sources in the form of die is a transparent resin layer having the function of protecting the die and the electrical contacts made on the die through wire bonding.

15. The device according to claim 1, wherein said stretches of metal wire are englobed within a protective layer of transparent resin.

16. The device according to claim 15, wherein said layer of transparent resin is deposited uniformly on all the array, with the exception of a peripheral region of the underlayer in which the terminals of said conductive paths are located.

17. The device according to claim 16, wherein said layer of transparent resin is a transparent overlayer having the function of eliminating any lack of uniformity of thickness formed in said layer of transparent resin following upon deposition.

18. The device according to claim 15, wherein said transparent resin is deposited in the form of paths, each of said paths connecting a group of dice addressed electrically in series or in parallel and belonging to one and the same segment of the image.

19. A method for the fabrication of a transparent device according to claim 1, wherein it comprises the following steps: i) preparation of the underlayer made of glass or plastic, coated with transparent conductive oxide; ii) separation of the columns of TCO through a photolithographic process or a laser-ablation process; iii) formation of metal pads, two for each die, one of which at least in part superimposed on the respective column of TCO and the other set between said column of TCO and the adjacent column of TCO, in areas corresponding to said row; iv) pick-and-place of the die on the respective metal pad; v) die-attach of the die with electrically and thermally conductive resin; vi) wire bonding between the top electrode of each individual die and the respective metal pad; and vii) wire bonding between the metal pad of each individual die and the metal pad of the subsequent die along the same address row.

20. The method of fabrication according to claim 19, wherein it comprises as further step deposition of a protective coating with transparent resin.

21. The method of fabrication according to claim 19, wherein said metal pads are deposited using a shadow-masking technique, or else a PVD technique, such as evaporation or sputtering, through a perforated mask.

22. The method of fabrication according to claim 21, wherein said metal pads are deposited through a PVD technique, such as evaporation or sputtering, followed by a process of microlithographic removal.

23. A method for the fabrication of a transparent device according to claim 1, wherein it comprises the following steps: i) preparation of the underlayer made of glass or plastic, coated with transparent conductive oxide; ii) separation of the columns of TCO through a photolithographic process or a laser-ablation process; iii) formation of metal pads, three for each die, the first of which is at least in part superimposed on the respective column of TCO, the second and the third of which are set between said column of TCO and the adjacent column of TCO, in areas corresponding to said row; iv) pick-and-place of the die on the respective metal pad; v) die-attach of the die with thermally conductive resin; vi) wire bonding between the electrodes of one and the same type (for example, the cathodes) of each individual die and the respective pads; vii) wire bonding between the electrodes of the other type (for example, the anodes) and the respective pads; and viii) wire bonding between the metal pad of each individual LED chip and the metal pad of the subsequent LED chip along the same address row.

24. The device according to claim 1, wherein said LED sources are arranged in a group configuration, in which the LEDs belonging to one and the same group are electrically connected in parallel so as to form a segment of curve, or of straight line, or of broken line.

25. The device according to claim 24, wherein each of said segments is constituted by a pair of substantially parallel paths, one of which is electrically connected to the electrodes of the same type, for example, the cathodes, of one of said groups of LEDs, whilst the other is electrically connected to the electrodes of the other type, for example, the anodes.

26. The device according to claim 25, wherein at the paths belonging to two different segments are electrically insulated from one another in areas corresponding to the points of intersection between said segments by interrupting the paths) of one of said segments so as to enable passage of the paths of the other segment and by connecting the stretches of said paths with the stretches of conductive wire deposited through a wire-bonding process.

27. The device according to claim 1, wherein said LED sources are arranged in a group configuration, in which the LEDs belonging to one and the same group are electrically connected in series so as to form a segment of curve, or of straight line, or of broken line.

28. The device according to claim 27, wherein the paths belonging to two different segments are electrically insulated from one another in areas corresponding to the points of intersection between said segments by interrupting the paths of one of said segments so as to enable passage of the paths of the other segment and by connecting the stretches of said paths with the stretches of conductive wire deposited through a wire-bonding process.

29. The device according to claim 1, wherein on the surface of the underlayer and/or of the overlayer micro-indentations are made in areas corresponding to the connection line between adjacent dice, in such a way that the points of light visible to the user when said dice are turned on are connected by segments of light also visible to the user.

30. The device according to claim 29, wherein the light image perceived by the user appears as a distribution of segments of curve, or of straight line, or of broken line.

31. The device according to claim 29, wherein said micro-indentations are in the form of cylindrical lenses having axes perpendicular to said connection line.

32. The device according to claim 29, wherein said micro-indentations are in the form of grooves made along an axis perpendicular to said connection line.

33. The device according to claim 29, wherein said micro-indentations are in the form of microlenses with rotational symmetry, each microlens having its axis of symmetry perpendicular to said underlayer and passing through the centre of one of said dice.

34. A transparent display for a motor vehicle according to claim 1, wherein it is designed for being installed on the dashboard of the vehicle, in such a way that the image presented to the driver is at least in part superimposed on the background, said background being visible to the driver through the windscreen of the vehicle.

35. The transparent display according to claim 34, wherein said display is used to present to the user images regarding navigation, in particular indications and arrows.

36. The transparent display according to claim 1, wherein said display is designed for being stuck to said windscreen of the motor vehicle.

37. The display according to claim 1, wherein said LED sources in the form of dice are angularly separated, with respect to the eyes of the user, by an angle of less than three minutes of arc.

38. The display according to claim 1, wherein the luminance of said LED sources is higher than 3000 $cd/m^2$.

39. The display according to claim 1, wherein the transmittance of the display is higher than 60%.

40. A motor vehicle comprising a display according to claim 1, wherein the display is installed on the dashboard of the motor vehicle, adjacent to the windscreen, in such a way that the image presented to the driver is at least in part superimposed on the background, said background being visible to the driver through the windscreen of the motor vehicle.

41. The motor vehicle according to claim 40, wherein said display is stuck on said windscreen of the motor vehicle.

42. The motor vehicle according to claim 40, wherein said display is used to present to the user images regarding navigation, in particular indications and arrows.

* * * * *